(12) United States Patent
Fang et al.

(10) Patent No.: US 9,437,750 B1
(45) Date of Patent: Sep. 6, 2016

(54) THIN FILM TRANSISTOR AND METHOD OF MAKING SAME

(71) Applicant: HON HAI PRECISION INDUSTRY CO., LTD., New Taipei (TW)

(72) Inventors: Kuo-Lung Fang, New Taipei (TW); Yi-Chun Kao, New Taipei (TW); Hsin-Hua Lin, New Taipei (TW); Chih-Lung Lee, New Taipei (TW); Po-Li Shih, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/726,160

(22) Filed: May 29, 2015

(30) Foreign Application Priority Data

Apr. 14, 2015 (TW) .................................. 104111918

(51) Int. Cl.
| | |
|---|---|
| *H01L 29/10* | (2006.01) |
| *H01L 29/786* | (2006.01) |
| *H01L 29/423* | (2006.01) |
| *H01L 29/66* | (2006.01) |
| *H01L 29/417* | (2006.01) |

(52) U.S. Cl.
CPC ... *H01L 29/78696* (2013.01); *H01L 29/41733* (2013.01); *H01L 29/42384* (2013.01); *H01L 29/66742* (2013.01)

(58) Field of Classification Search
CPC .................... H01L 27/3262; H01L 29/42384; H01L 29/78696; H01L 29/66742

USPC .......................................................... 257/66
See application file for complete search history.

(56) References Cited

U.S. PATENT DOCUMENTS

| 7,982,296 | B2 * | 7/2011 | Nuzzo ..................... | B82Y 10/00 257/466 |
|---|---|---|---|---|
| 2003/0085404 | A1 * | 5/2003 | Kim ..................... | G02F 1/13458 257/72 |
| 2008/0113473 | A1 * | 5/2008 | Heo ..................... | H01L 27/1214 438/149 |

FOREIGN PATENT DOCUMENTS

CN 103915444 A 7/2014

* cited by examiner

*Primary Examiner* — Douglas Menz
(74) *Attorney, Agent, or Firm* — Zhigang Ma

(57) ABSTRACT

A method for forming a TFT includes providing a substrate, and forming a gate electrode, an electrically insulating layer, a semiconductor layer, an etch stop layer and a photoresist layer successively on the substrate. A photolithographic process is performed to the photoresist layer by using a half-tone mask to thereby configure the photoresist layer to have two recesses in a top thereof. Two lateral ends of the etch stop layer are etched away to form an etch stop pattern. The photoresist layer is heated to flow downwardly. Two lateral ends of the semiconductor channel are etched away to become a channel layer. An ashing is performed to the photoresist layer to have the recesses thereof communicate atmosphere with the etch stop pattern. The etch stop pattern is etched to define first and second through holes. Source and drain electrodes are formed to electrically connect with the channel layer.

12 Claims, 11 Drawing Sheets

THIN FILM TRANSISTOR AND METHOD OF MAKING SAME

CROSS-REFERENCE TO RELATED APPLICATIONS

This application claims priority to Taiwan Patent Application No. 104111918 filed on Apr. 14, 2015, the contents of which are incorporated by reference herein.

FIELD

The subject matter herein generally relates to a thin film transistor, and particularly to a self-aligned metal oxide thin film transistor (TFT) having a simple and low-cost manufacturing and a precise dimension. The present disclosure is also related to a method for manufacturing such self-aligned metal oxide TFT.

BACKGROUND

In manufacturing a metal oxide TFT, six photolithographic processes each consisting of masking, light exposure and etching are required to form the metal oxide TFT, which include to form the gate electrode, the metal oxide (channel) layer, the etch stop layer, the source and drain electrodes, the through holes in an insulating layer over the source and drain electrodes and the pixel electrodes over the insulating layer. The six masking steps of the six photolithographic processes are expensive and complicated.

Furthermore, the TFT made by the method having such numerous masking steps has a poor dimensional precision, since each masking step needs to align the mask with the TFT, which unavoidably results in a tolerance. The disadvantage of the poor dimensional precision becomes more unfavorable in view of the current trend of high definition display.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the present self-aligned metal oxide TFT. Moreover, in the drawings, like reference numerals designate corresponding parts throughout the several views.

DETAILED DESCRIPTION

Figure 1:
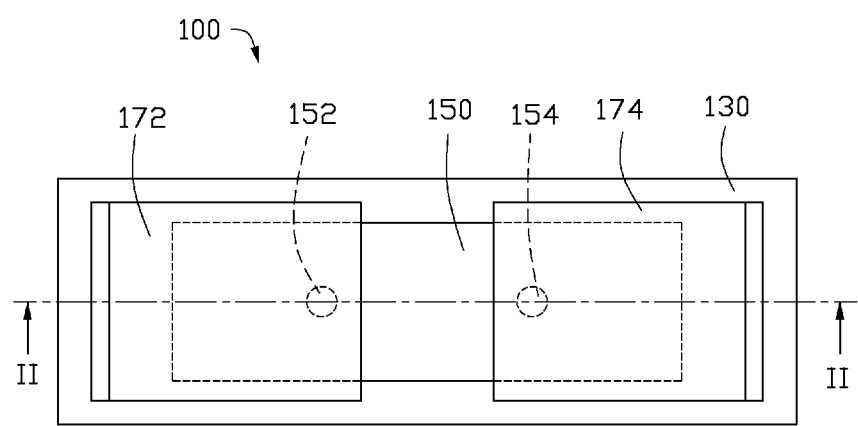
FIG. 1 is a top plan view showing a self-aligned metal oxide TFT in accordance with the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

Figure 2:
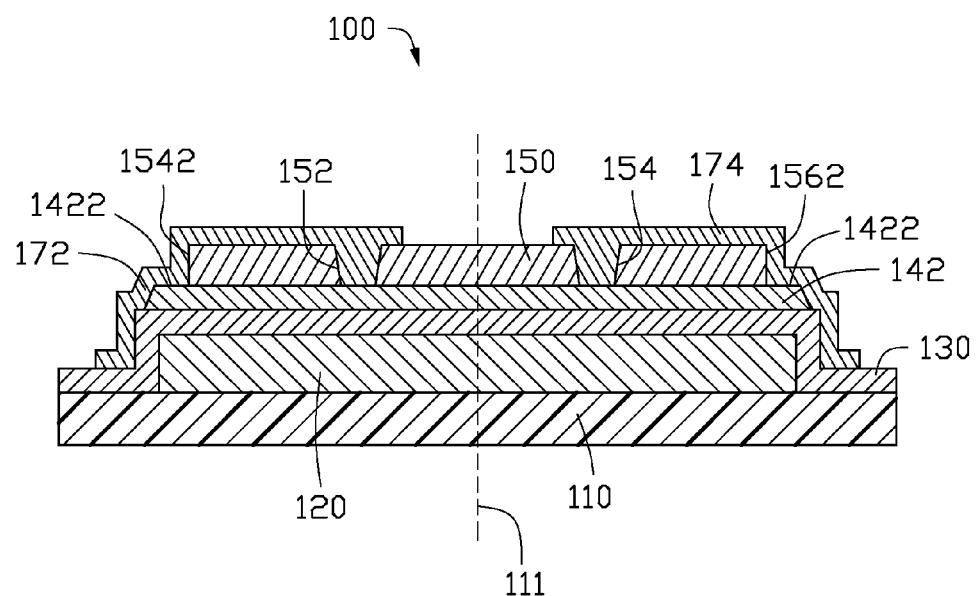
FIG. 2 is a cross-sectional view of the TFT of FIG. 1, taken along line II-II thereof.

Referring to FIGS. 1 and 2, FIG. 1 is a top plan view of a self-aligned metal oxide thin film transistor (TFT) 100 in accordance with the present disclosure, while FIG. 2 is a cross-sectional view taken along line II-II of FIG. 1. The self-aligned metal oxide thin film TFT 100 includes a substrate 110, a gate electrode 120 over a middle of the substrate 110, an electrically insulating layer 130 over the substrate 110 and the gate electrode 120, a channel layer 142 over a middle of the electrically insulating layer 130 and located corresponding to the gate electrode 120, an etch stop pattern 150 over the channel layer 142, and a source electrode 172 and a drain electrode 174 located at two opposite sides of the electrically insulating layer 130, the channel layer 142 and the etch stop pattern 150, respectively. The etch stop pattern 150 defines a first through hole 152 and a second through hole 154. The source electrode 172 extends into the first through hole 152 to mechanically and electrically connect with the channel layer 142. The drain electrode 174 extends into the second through hole 154 to connect with the channel layer 142. Each through hole 152, 154 is tapered along a direction from the etch stop pattern 150 to the substrate 110.

The electrically insulating layer 130 totally covers the gate electrode 120 to insulate the gate electrode 120 from the source and drain electrodes 172, 174 and the channel layer 142. The channel layer 142 is located above the gate electrode 120 and aligned therewith and interconnects the source and drain electrodes 172, 174. The source electrode 172 extends inwardly from a lateral side of the electrically insulating layer 130 to reach the first through hole 152, while the drain electrode 174 extends inwardly from an opposite lateral side of the electrically insulating layer 130 to reach the second through hole 154.

Figure 3:
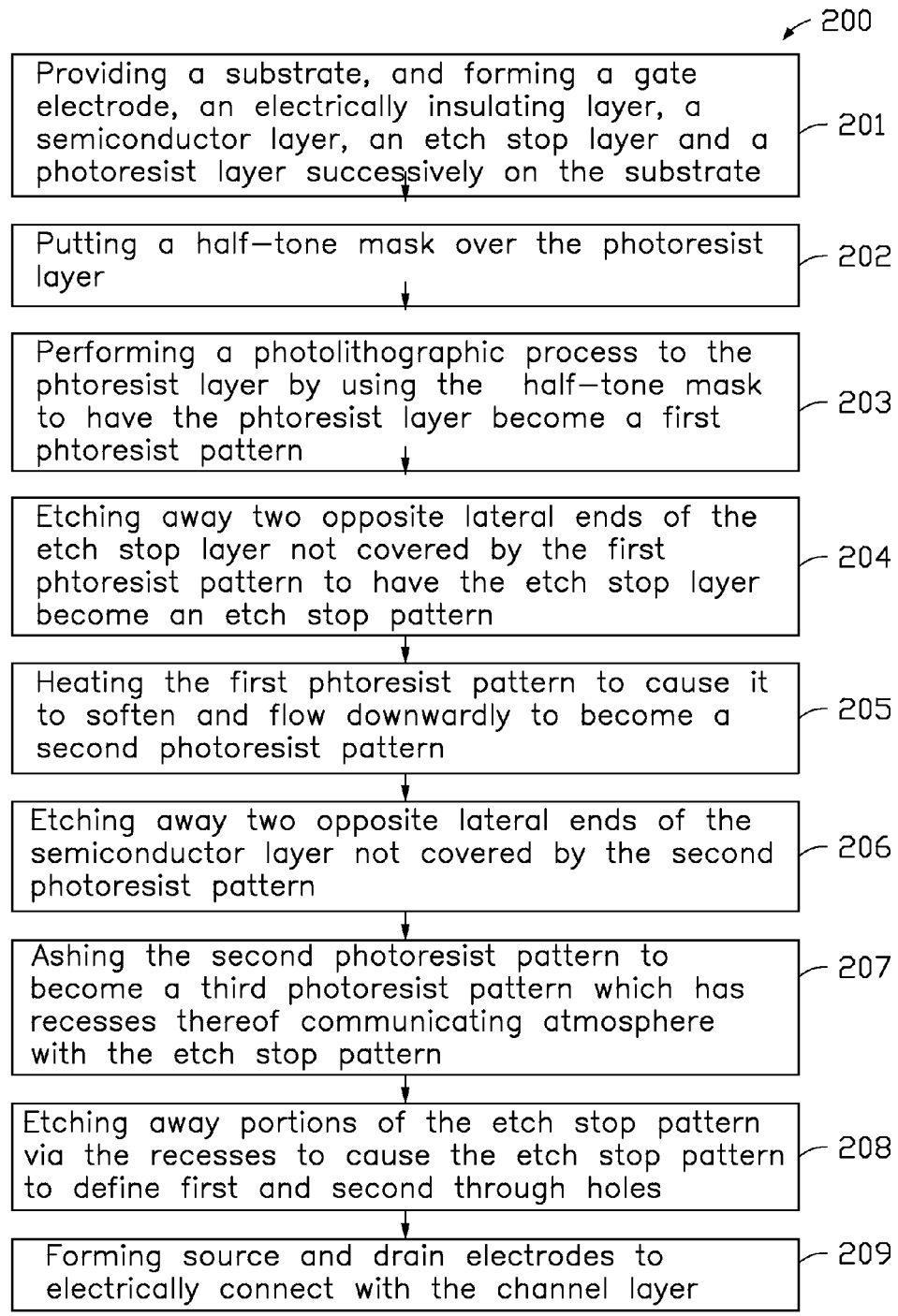
FIG. 3 is a flowchart showing a method for forming the TFT of FIG. 1 in accordance with the present disclosure.

Referring to FIG. 3, a flowchart of an example method 200 for manufacturing the TFT 100 is shown. The example method 200 is provided by way of example, as there are a variety of ways to carry out the method. The example method 200 described below can be carried out using the configurations illustrated in FIGS. 1-2 and 4-11, for example, and various elements of these figures are referenced in explaining the example method 200. Each block shown in FIG. 3 represents one or more processes, methods or subroutines, carried out in the example method 200. Furthermore, the illustrated order of blocks is illustrative only and the order of the blocks can change according to the present disclosure. Additional blocks can be added or fewer blocks may be utilized, without departing from this disclosure. The example method 200 can begin at block 201.

Figure 4:
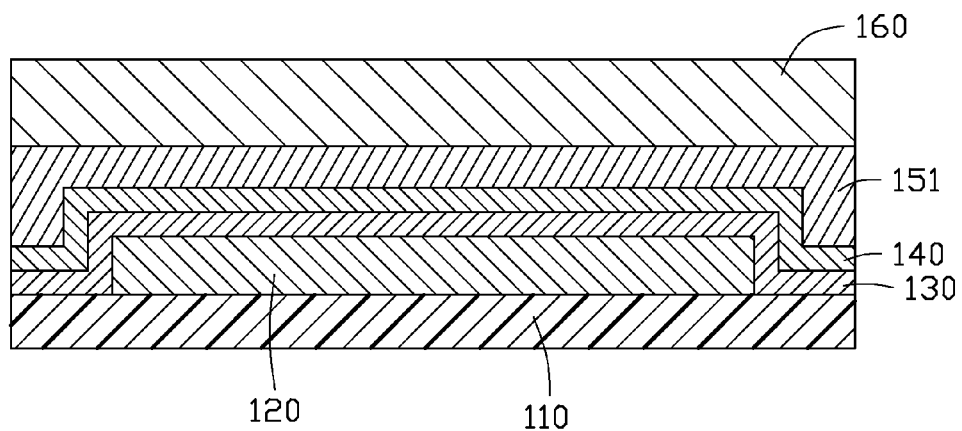
FIG. 4 is a cross-sectional view showing a structure corresponding to a first block of the method of FIG. 3.

At block 201, also referring to FIG. 4, in which the substrate 110 is provided and the gate electrode 120 is formed on the middle of the substrate 110. The electrically insulating layer 130 is formed on the substrate 110 to totally cover the gate electrode 120. Then a semiconductor layer 140, an etch stop layer 151 and a photoresist layer 160 are successively formed on the electrically insulating layer 130.

In more detail, the gate electrode 120 is formed by first applying a metal layer on a top face of the substrate 110. Then photolithography is used to process the metal layer to obtain a required pattern to form the gate electrode 120 on the substrate 110. The material for forming the substrate 110 can be chosen from glass, quartz, organic polymer, or other suitable transparent material. The material for forming the gate electrode 120 can be metal or an alloy thereof, such as molybdenum (Mo), aluminum (Al), chromium (Cr), copper (Cu), neodymium (Nd) or an alloy thereof.

The material for forming the electrically insulating layer 130 can be chosen from inorganic material such as silicon dioxide, silicon nitride, or silicon nitride oxide, organic material or other suitable material or a combination thereof. The formation of the electrically insulating layer 130 can be achieved by plasma-enhanced chemical vapor deposition (PEVCD). The material for forming the semiconductor layer 140 can be chosen from amorphous silicon, polycrystalline silicon, metal oxide or oxide semiconductor which is suitable for use in constructing a channel layer for a TFT, such as indium gallium zinc oxide (IGZO), zinc oxide (ZnO), indium oxide (InO), gallium oxide (GaO) or a mixture thereof. The material for forming the etch stop layer 151 can be chosen from silicon nitride, silicon oxide or other dielectric material. The photoresist layer 160 is a mixture mainly consisting of photo-active compound and resin. The resin is thermoplastic. The photoresist layer 160 can have a thickness of 1.25-2.5 micrometer. In at least one embodiment, the photoresist layer 160 has a thickness of 1.5 micrometer. The photoresist layer 160 is made of a positive resist which is a type of photoresist in which the portion of the photoresist that is exposed to light becomes soluble to the photoresist developer. Alternatively, the photoresist layer 160 can be made of a negative resist.

Figure 5:
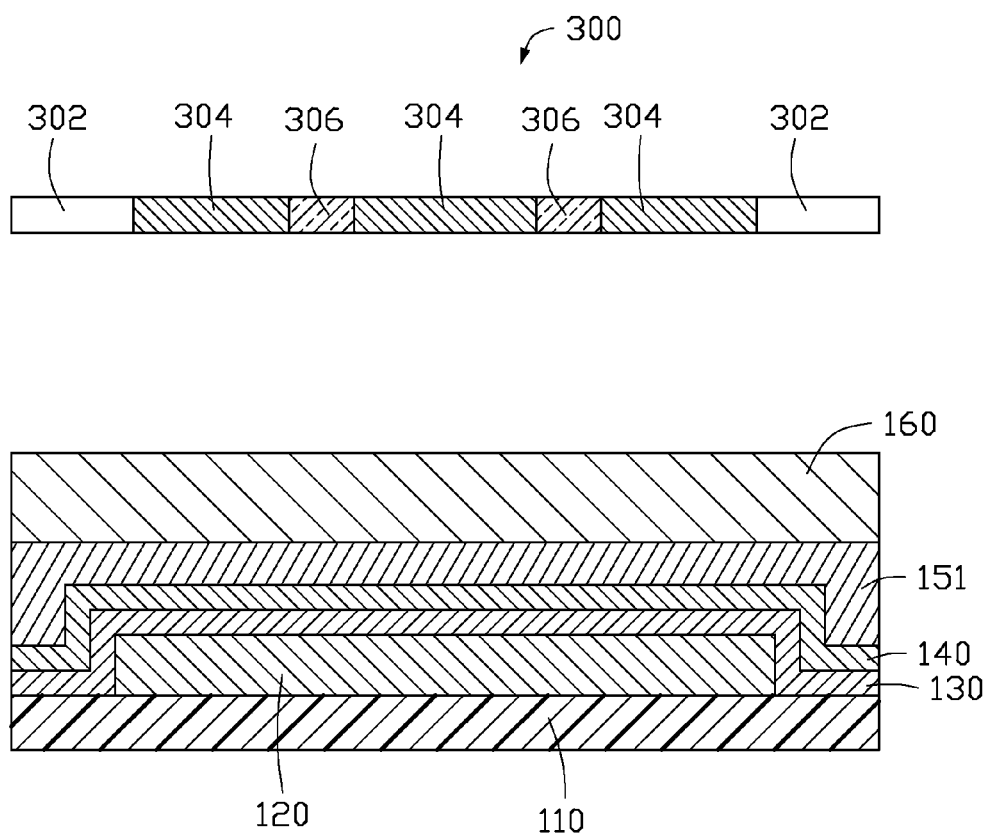
FIG. 5 is similar to FIG. 4 showing a structure corresponding to a second block of the method of FIG. 3.

At block 202, referring to FIG. 5, a half-tone (gray-tone) mask 300 which is used to process photolithography to the photoresist layer 160 is put over the photoresist layer 160. The half-tone mask 300 has two full-transmission regions 302 located two opposite end portions of the mask 300. Three non-transmission regions 304 located between the two full-transmission regions 302 and two half-transmission regions 306 are alternated with the three non-transmission regions 304. The two full-transmission regions 302 are located correspondingly over two opposite end portions of the photoresist layer 160, while one of the non-transmission layers 304 is located correspondingly over a center of the photoresist layer 160.

Figure 6:
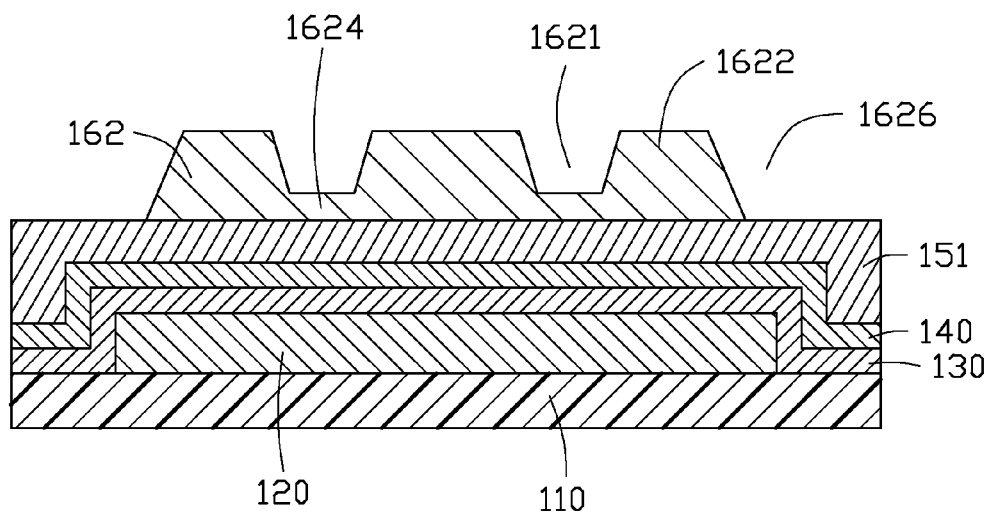
FIG. 6 is similar to FIG. 4, showing a structure corresponding to a third block of the method of FIG. 3.

At block 203, referring to FIG. 6, a photolithographic process is performed to the photoresist layer 160, and, after the photolithographic process, the photoresist layer 160 is patterned to from a first photoresist pattern 162. The first photoresist pattern 162 is positioned corresponding to the gate electrode 120. By the half-tone mask 300 and after light exposure and etching of the photoresist layer 160, the obtained first photoresist pattern 162 is configured having a trapezoidal cross section with a longer bottom side. Two recesses 1621 are defined in a top of the first photoresist pattern 162 to cause the first photoresist pattern 162, in cross section, to have three mountain portions 1622 alternated with two valley portions 1624. Each mountain portion 1622 has a height which is substantially double of a height of each valley portion 1624. Each recess 1621 has a trapezoidal cross section with a longer top side. A space 1626 is defined between each of two lateral sides of the first photoresist pattern 162 and a top of each of two opposite lateral end portions of the etch stop layer 151.

Figure 7:
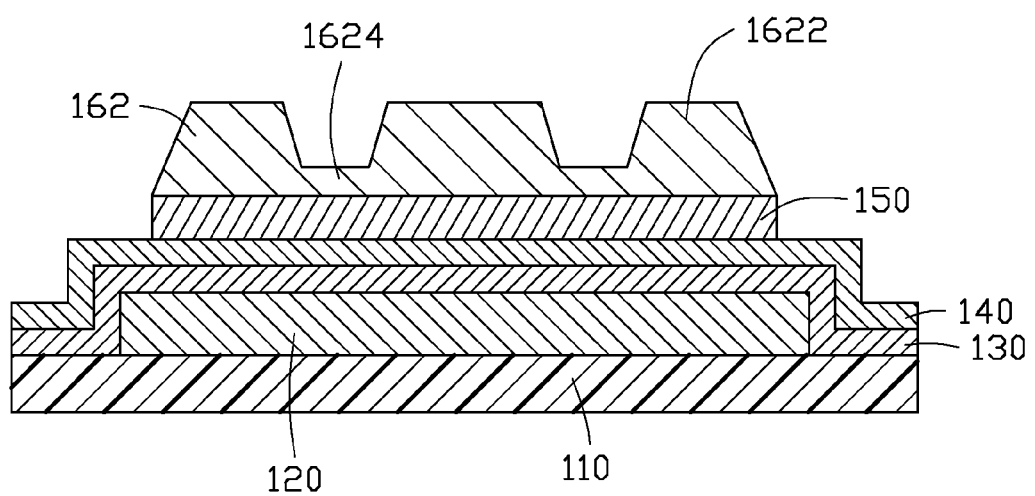
FIG. 7 is similar to FIG. 4, showing a structure corresponding to a fourth block of the method of FIG. 3.

At block 204, referring to FIG. 7, the two opposite lateral end portions of the etch stop layer 151 which are not covered by the first photoresist pattern 162 are etched away to form the etch stop pattern 150. Lateral side edges of the etch stop pattern 150 are aligned with lateral end edges of the bottom of the first photoresist pattern 162. The etching used at block 204 of the method 200 can be dry etching by applying plasma to the etch stop layer 151.

Figure 8:
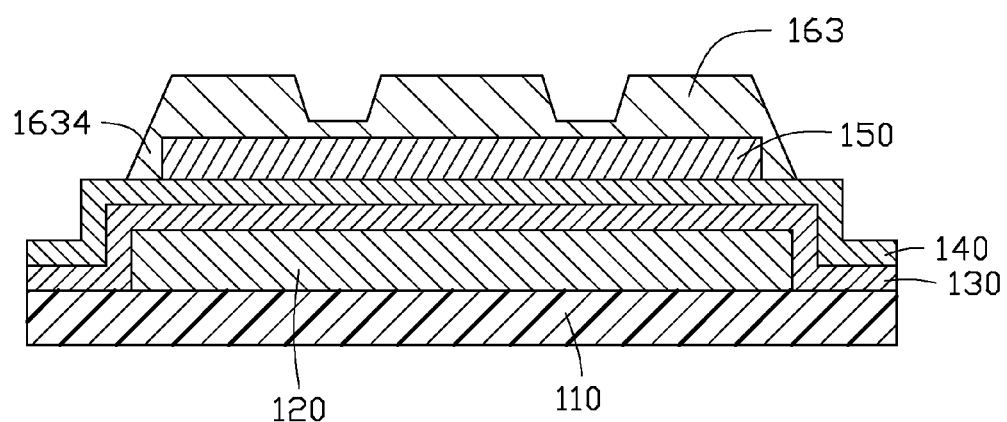
FIG. 8 is similar to FIG. 4, showing a structure corresponding to a fifth block of the method of FIG. 3.

At block 205, referring to FIG. 8, the first photoresist pattern 162 is heated by reflow, i.e., moving the semi-finished product of FIG. 7 through an oven which can be an infrared oven or a simple heating platen, to cause the first photoresist pattern 162 to soften and flow downwardly from its position as shown in FIG. 7 to a position as shown in FIG. 8, whereby the first photoresist pattern 162 become a second photoresist pattern 163. The temperature for heating the first photoresist pattern 162 is in a range between 80 and 175 degrees Celsius. A bottom portion 1634 of the second photoresist pattern 163 totally covers the etch stop pattern 150 and a middle portion of the semiconductor layer 140.

Figure 9:
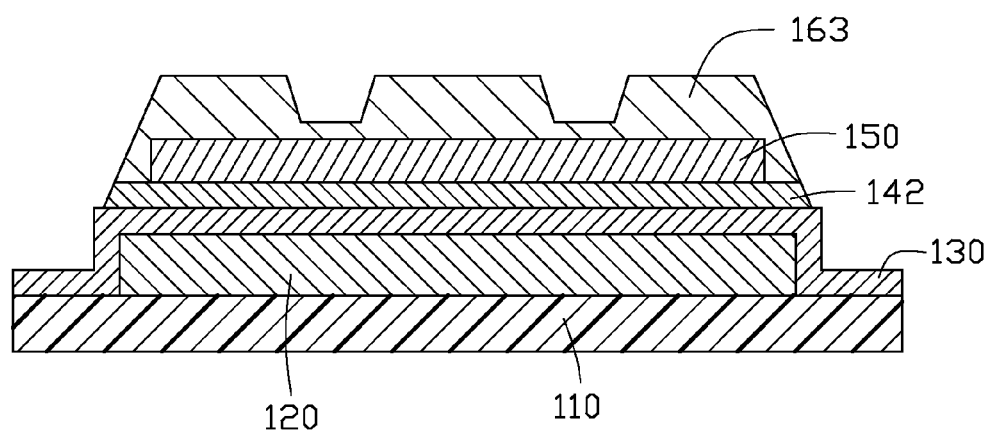
FIG. 9 is similar to FIG. 4, showing a structure corresponding to a sixth block of the method of FIG. 3.

At block 206, referring to FIG. 9, opposite lateral end portions of the semiconductor layer 140 which are not covered by the second photoresist pattern 163 are etched away. The etching at block 206 of the method 200 can be a wet etching, using acid solution to remove the exposed portions of the semiconductor layer 140. At block 206, the semiconductor layer 140 becomes the channel layer 142 for the TFT 100.

Figure 10:
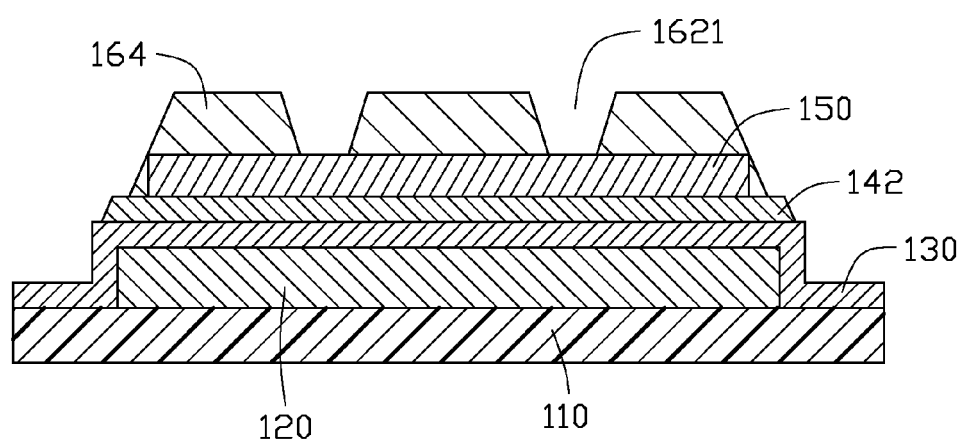
FIG. 10 is similar to FIG. 4, showing a structure corresponding to a seventh block of the method of FIG. 3.

At block 207, also referring to FIG. 10, the second photoresist pattern 163 is subjected to an ashing process by injecting oxygen ($O_2$) or ozone ($O_3$) to the second photoresist pattern 163 whereby the second photoresist pattern 163 becomes a third photoresist pattern 164 which is thinner and shorter than the second photoresist pattern 163. After the ashing process, a top of the etch stop pattern 150 is in communication with atmosphere via the recesses 1621 in the third photoresist pattern 164.

Figure 11:
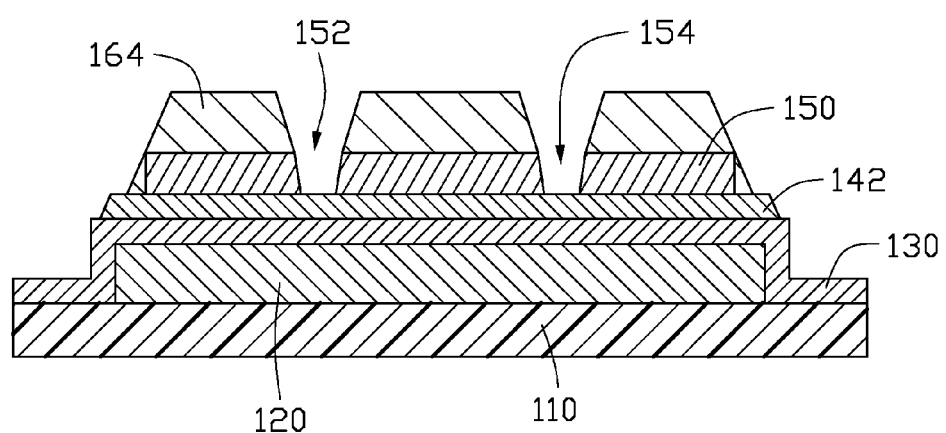
FIG. 11 is similar to FIG. 4, showing a structure corresponding to an eighth block of the method of FIG. 3.

At block 208, please referring to FIG. 11, two portions of the etch stop pattern 150 under the recesses 1621 are etched away by using plasma to cause the etch stop pattern 150 to define the first and second through holes 152, 154.

At block 209, also referring to FIGS. 1 and 2, the third photoresist pattern 164 is stripped away, and two metal slugs are deposited one two opposite lateral ends of the electrically insulating layer 130, the channel layer 142 and the etch stop pattern 150 to form the source and the drain electrodes 172, 174 to complete the formation of the TFT 100 of FIGS. 1 and 2. Each of the source electrode 172 and the drain electrode 174 has a portion extending into a corresponding one of the first and second through holes 152, 154. An inner end of the source electrode 172 is spaced from an inner end of the drain electrode 174.

According to the present disclosure, a single masking process using the half-tone mask 300 can be used to form both the channel layer 142 and the etch stop pattern 150 whereby the cost for forming the TFT 100 can be lowered. Furthermore, since the TFT 100 can be manufactured by a method which has less masking processes, the TFT 100 can have a more precise dimension. Particularly, the channel layer 142 is symmetrical in relative to a central line 111 of the substrate 110 of the TFT 100. A length of each of two lateral sides 1422 of the channel layer 142 located laterally beyond a lateral outer side 1542 (1562) of the etch stop pattern 150 is substantially equal to each other, which is about 0.3-0.5 micrometer.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. A method for forming a thin film transistor comprising:
providing a substrate;
forming a gate electrode on the substrate;
forming an electrically insulating layer on the substrate to cover the gate electrode therein;
forming a semiconductor layer on the electrically insulating layer;
forming an etch stop layer on the semiconductor layer;
forming a photoresist layer on the etch stop layer;
processing the photoresist layer by photolithography using a mask to have the photoresist layer become a first photoresist pattern which has a configuration in cross section of a trapezoid defining at least two recesses in a top thereof;
etching two lateral end portions of the etch stop layer which are not covered by the first photoresist pattern, whereby the etch stop layer becomes an etch stop pattern;
deforming the first photoresist pattern to cause the first photoresist pattern to move downwardly to reach the semiconductor layer, whereby the first photoresist pattern becomes a second photoresist pattern;
etching two lateral end portions of the semiconductor layer which are not covered by the second photoresist pattern, whereby the semiconductor layer becomes a channel layer for the thin film transistor;
ashing the second photoresist pattern to cause the second photoresist pattern to become a third photoresist pattern having the at least two recesses, the etch stop pattern being exposed to atmosphere via the at least two recesses in the third photoresist pattern;
etching the etch stop pattern via the at least two recesses in the third photoresist pattern to cause the etch stop pattern to define at least a first through hole and at least a second through hole therein;
removing the third photoresist pattern; and
forming a source electrode electrically coupling with a lateral end of the channel layer and a drain electrode electrically coupling with an opposite lateral end of the channel layer.

2. The method of claim 1, wherein the mask is a half-tone mask.

3. The method of claim 2, wherein the half-tone mask has two full-transmission regions located at two lateral ends thereof, three non-transmission regions located between the two full-transmission regions and two half-transmission regions alternated with the non-transmission regions, the at least two recesses being two recesses, the two half-transmission regions being for forming the two recesses, the recesses each having a depth which is substantially equal to a half of a height of the first photoresist pattern.

4. The method of claim 2, wherein the deformation of the first photoresist pattern is achieved by heating the first photoresist pattern.

5. The method of claim 4, wherein the heating of the first photoresist pattern is achieved by reflow at a temperature of 80-175 degree Celsius.

6. The method of claim 4, wherein the ashing of the second photoresist pattern is achieved by injecting one of oxygen and ozone to the second photoresist pattern.

7. The method of claim 4, wherein the second photoresist pattern has a length and a height which are less than a length and a height of the first photoresist pattern.

8. The method of claim 4, wherein a bottom of the trapezoid of the cross section of the first photoresist pattern is longer than a top thereof, and wherein the at least two recesses each have a cross section of a trapezoid with a top thereof being larger than a bottom thereof.

9. The method of claim 4, wherein the source electrode extends downwardly into the at least a first through hole to electrically connect with the channel layer, the drain electrode extending downwardly into the at least a second through hole to electrically connect with the channel layer.

10. The method of claim 9, wherein the channel layer is symmetrical to a center of the substrate.

11. The method of claim 9, wherein a length of a lateral end portion of the channel layer extending laterally beyond a lateral side of the etch stop pattern is equal to a length of an opposite lateral end portion of the channel layer extending laterally beyond an opposite lateral side of the etch stop pattern.

12. The method of claim 11, wherein the length is in a range between 0.3 micrometer and 0.5 micrometer.

* * * * *